United States Patent
Schaller et al.

(10) Patent No.: US 8,575,041 B2
(45) Date of Patent: Nov. 5, 2013

(54) REPAIR OF DAMAGED SURFACE AREAS OF SENSITIVE LOW-K DIELECTRICS OF MICROSTRUCTURE DEVICES AFTER PLASMA PROCESSING BY IN SITU TREATMENT

(75) Inventors: Matthias Schaller, Boxdorf (DE); Daniel Fischer, Dresden (DE); Thomas Oszinda, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 133 days.

(21) Appl. No.: 13/233,590

(22) Filed: Sep. 15, 2011

(65) Prior Publication Data

US 2013/0072018 A1   Mar. 21, 2013

(51) Int. Cl.
   *H01L 21/469*   (2006.01)
(52) U.S. Cl.
   USPC ........................................ 438/788; 438/787
(58) Field of Classification Search
   USPC .................................. 438/787, 788
   See application file for complete search history.

(56) References Cited

U.S. PATENT DOCUMENTS

| 2011/0117678 A1* | 5/2011 | Varadarajan et al. ............. 438/4 |
| 2011/0151590 A1* | 6/2011 | Carducci et al. ................. 438/4 |
| 2012/0049383 A1 | 3/2012 | Schaller et al. ............... 257/774 |

FOREIGN PATENT DOCUMENTS

DE   102010040071 A1   3/2012

OTHER PUBLICATIONS

Translation of Official Communication from German Patent Office for German Patent Application No. 10 2011 090 164.7 dated Jul. 23, 2012.

* cited by examiner

*Primary Examiner* — Bradley K Smith
(74) *Attorney, Agent, or Firm* — Williams, Morgan & Amerson, P.C.

(57) ABSTRACT

Damaged surface areas of low-k dielectric materials may be efficiently repaired by avoiding the saturation of dangling silicon bonds after a reactive plasma treatment on the basis of OH groups, as is typically applied in conventional process strategies. The saturation of the dangling bond may be accomplished by directly initiating a chemical reaction with appropriate organic species, thereby providing superior reaction conditions, which in turn results in a more efficient restoration of the dielectric characteristics.

25 Claims, 3 Drawing Sheets

REPAIR OF DAMAGED SURFACE AREAS OF SENSITIVE LOW-K DIELECTRICS OF MICROSTRUCTURE DEVICES AFTER PLASMA PROCESSING BY IN SITU TREATMENT

BACKGROUND OF THE INVENTION

1. Field of the Invention

Generally, the present disclosure relates to microstructures, such as advanced integrated circuits, and, more particularly, to material systems dielectrics having a low dielectric constant, such as silicon oxide-based dielectrics.

2. Description of the Related Art

When fabricating modern microstructures, such as integrated circuits, there is a continuous drive to improve performance in view of operational behavior and diversity of functions integrated in a single microstructure device. For this purpose, there is an ongoing demand to steadily reduce the feature sizes of microstructure elements, thereby enhancing performance of these structures. For instance, in modern integrated circuits, minimum feature sizes, such as the channel length of field effect transistors, have reached the deep sub-micron range, thereby increasing performance of these circuits in terms of speed and/or power consumption and/or diversity of functions. As the size of individual circuit elements is reduced with every new circuit generation, thereby improving, for example, the switching speed of the transistor elements, frequently new materials may be required in order to not unduly offset any advantages that may be achieved by reducing the feature sizes of the individual components of microstructure devices, such as circuit elements and the like. For instance, upon shrinking the critical dimensions of transistors, thereby increasing the density of individual circuit elements, the available floor space for interconnect lines electrically connecting the individual circuit elements is also decreased. Consequently, the dimensions of these interconnect lines are also implemented with reduced dimensions in order to compensate for a reduced amount of available floor space and for an increased number of circuit elements provided per unit die area as typically two or more interconnections are required for each individual circuit element. Thus, a plurality of stacked wiring layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like.

Advanced integrated circuits, including transistor elements having a critical dimension of 0.05 μm and even less, may, therefore, typically be operated at significantly increased current densities of up to several kA per $cm^2$ in the individual interconnect structures despite the provision of a relatively large number of metallization layers owing to the increased number of circuit elements per unit area. Consequently, well-established materials, such as aluminum, are being replaced by copper and copper alloys, i.e., materials with a significantly lower electrical resistivity and improved resistance to electromigration even at considerably higher current densities compared to aluminum.

The introduction of copper into the fabrication of microstructures and integrated circuits comes along with a plurality of severe problems residing in copper's characteristics to readily diffuse in silicon dioxide and other dielectric materials, as well as the fact that copper may not be readily patterned on the basis of well-established plasma-assisted etch recipes. For example, based on conventional plasma-assisted etch processes, copper may not substantially form any volatile etch byproducts, such that the patterning of a continuous copper layer with a thickness that is appropriate for forming metal lines may not be compatible with presently available etch strategies. Consequently, the so-called damascene or inlaid process technique may typically be applied in which a dielectric material is formed first and is subsequently patterned in order to receive trenches and via openings, which are subsequently filled with the copper-based material by using, for instance, electrochemical deposition techniques. Moreover, copper has a pronounced diffusivity in a plurality of dielectric materials, such as silicon dioxide-based materials, which are frequently used as interlayer dielectric materials, thereby requiring the deposition of appropriate barrier materials prior to actually filling corresponding trenches and via openings with the copper-based material. Although silicon nitride and related materials have excellent diffusion blocking capabilities, using silicon nitride as an interlayer dielectric material is less than desirable due to the moderately high dielectric constant, which may result in a non-acceptable performance degradation of the metallization system. Similarly, in sophisticated applications, the reduced distance of metal lines requires a new type of dielectric material in order to reduce signal propagation delay, cross-talking and the like, which are typically associated with a moderately high capacitive coupling between neighboring metal lines. For this reason, increasingly so-called low-k dielectric materials are being employed, which generally have a dielectric constant of 3.0 or less, thereby maintaining the parasitic capacitance values in the metallization system at an acceptable level, even for the overall reduced dimensions in sophisticated applications.

Since silicon dioxide has been widely used in the fabrication of microstructure devices and integrated circuits, a plurality of modified silicon oxide-based materials have been developed in recent years in order to provide dielectric materials with a reduced dielectric constant on the basis of precursor materials and process techniques that are compatible with the overall manufacturing process for microstructure devices and integrated circuits. For instance, silicon oxide materials with a moderately high amount of carbon and hydrogen, for instance referred to as SiCOH materials, have become a frequently used low-k dielectric material, which may be formed on the basis of a plurality of precursor materials, such as silane-based materials in combination with ammonium and the like, applied by chemical vapor deposition (CVD) techniques and the like. In other cases, spin-on glass (SOG) materials may be modified so as to contain a desired high fraction of carbon and hydrogen, thereby providing the desired low dielectric constant.

In still other sophisticated approaches, the dielectric constant of these materials is even further reduced by incorporating a plurality of cavities of nano dimensions, also referred to as pores, which may represent gas-filled or air-filled cavities within the dielectric material, thereby obtaining a desired further reduced dielectric constant. Although the permittivity of these dielectric materials is reduced by incorporating carbon and forming a corresponding porous structure, which may result in a very enlarged surface area at interface regions connecting to other materials, the overall mechanical and chemical characteristics of these low-k and ultra low-k (ULK) materials are usually significantly altered compared to conventional dielectric materials and may result in additional problems during the processing of these materials.

For example, as discussed above, the dielectric material is typically provided first and is then patterned so as to receive trenches and via openings, thereby requiring the exposure of the sensitive low-k dielectric materials to various reactive process atmospheres. That is, the patterning of the dielectric material may typically involve the formation of an etch mask based on a resist material and the like followed by plasma-assisted etch processes in order to form the trenches and via openings corresponding to the design rules of the device under consideration. Thereafter, usually cleaning processes may have to be performed in order to remove contaminants and other etch byproducts prior to depositing materials, such as conductive barrier materials and the like. Consequently, at least certain surface areas of the sensitive low-k dielectric materials are exposed to the influence of a reactive plasma in processes such as etch processes, resist strip processes performed on the basis of an oxygen plasma, wet chemical reagents in the form of acids, aggressive bases, alcohols and the like, which may thus result in a certain degree of surface modification or damage. For instance, the low-k dielectric materials are typically provided with a hydrophobic surface in order to hinder the incorporation of OH groups and the like, which represent polarizable groups that may therefore efficiently respond to an electrical field, thereby significantly increasing the resulting permittivity of the surface portion of the material.

When exposing the sensitive low-k dielectric material to reactive process atmospheres, such as a plasma-assisted etch process, aggressive wet chemical reagents and the like, the hydrocarbon groups of the hydrophobic surface area are greatly removed, thereby generating a plurality of non-saturated silicon bonds at the surface and within a certain interface layer, which may have a thickness of several nanometers to 20 nm or more. Consequently, after patterning the sensitive low-k dielectric material, for instance for forming via openings and trenches therein, any exposed surface areas thereof and in particular the inner sidewall surface areas of the openings comprises a significant amount of dangling silicon bonds, which may efficiently react with moisture in the ambient atmosphere after the reactive etch process. Consequently silanol groups (OH) react with the non-saturated silicon bonds and thus form a surface layer comprising highly polarized molecules, which in turn additionally result in adsorption of moisture and the like. Consequently, the interface layer of the sensitive low-k dielectric material may comprise a significant amount of polarizable molecules, which in turn results in a significantly enhanced dielectric constant locally at the openings. This may thus lead to a significant parasitic capacitance of metal lines and vias to be formed on the basis of the previously etched openings. Furthermore, the silanol groups and the additional moisture adhering thereto may influence the further processing, for instance when forming a barrier material and the like, which may result in a less reliable electromigration behavior and the like. Consequently, the general reduction of the dielectric constant of the dielectric materials of complex metallization layers may be offset to a pronounced degree due to the incorporation of silanol groups and moisture at an interface between the dielectric material and the metal lines and vias. Hence, great efforts are being made in providing silicon oxide-based low-k dielectric materials while avoiding or at least reducing the surface modifications caused by the patterning of the sensitive dielectric materials and the subsequent exposure to moisture-containing process ambients. In some conventional strategies, it has been suggested to selectively remove the damaged surface layer of the low-k dielectric materials on the basis of appropriate etch strategies, which may particularly remove the polarizable molecules without unduly damaging the hydrophobic nature of the resulting new surface layer. In this case, however, appropriate etch recipes have to be applied without exposure of the resulting structure to any further aggressive process atmospheres in order to maintain the hydrophobic nature of the newly formed surface until the conductive barrier material and the like is deposited. This requires significant efforts in finding appropriate etch recipes, thereby contributing to increased process complexity. Additionally, the material removal results in an increase of the critical dimensions of the metal lines and vias, which may be undesirable in view of enhanced packing density, since the increased critical dimensions have to be taken into consideration when designing the metallization system under consideration. On the other hand, a reduction of the initial critical dimension may not be compatible with the patterning capabilities in the metallization layer under consideration. Consequently, in other alternative approaches, the hydrophobic nature and thus the dielectric properties may partially be restored by applying a so-called low-k repair by means of silylation. In this case, appropriate chemicals react with the previously generated silanol groups on the dielectric surface, wherein the hydrogen atom is substituted by an appropriate functional group including methyl groups, thereby providing a hydrophobic surface area for the further processing of the device and also reestablishing to a certain degree the low dielectric constant locally at the surface areas. In order to initiate the silylation reaction, it is, however, necessary to expose the device to the ambient atmosphere after the plasma-based patterning process in order to saturate the dangling silicon bonds with the silanol groups. Although a plurality of the hydrogen atoms of the silanol groups may be replaced with appropriate functional groups containing hydrogen and carbon, nevertheless the oxygen atom of the silanol group may remain in the damaged surface region, thereby generally affecting the dielectric and chemical characteristics of the dielectric material. Moreover, typical silylation chemicals comprise molecules of large size, which may not efficiently diffuse into the surface of the damaged interface layer, which may thus result in moderately long process times and/or a reduced degree of substitution of the hydrogen atoms with methyl group containing species. Furthermore, as discussed above, upon exposing the damaged sensitive low-k dielectric material to an ambient atmosphere in order to form the silanol groups, water molecules may also adsorb to the polarizable molecules and corresponding hydrogen bonds may strongly reduce the reaction of the silylation molecules with the silanol groups due to the steric hindrance caused by molecules adhering to the damaged surface.

Consequently, although a surface treatment with chemical reagents may provide a certain degree of restoration of the hydrophobic surface conditions of porous silicon dioxide-based dielectric materials, the resulting interface formed between the restored dielectric material and the metal material may still have an increased dielectric constant and chemical characteristics may differ from the characteristics of the low-k dielectric material that has initially been formed.

In view of the situation described above, the present disclosure relates to manufacturing techniques in which silicon dioxide-based low-k dielectric materials may be exposed to plasma treatments or other reactive process techniques, while avoiding or at least reducing the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques for enhancing the surface characteristics of low-k dielectric materials, such as silicon oxide-based materials, by reestablishing a desired surface structure which may be damaged by plasma-assisted processes, such as plasma etching, plasma resist stripping, plasma enhanced deposition processes and the like.

That is, as previously discussed, the low-k dielectric materials, frequently provided with an additional porous structure, have a substantially unipolar nature, i.e., a hydrophobic nature, wherein typically methyl groups are present at the surface. During the plasma-based reactive treatments, the methyl groups may be removed within a certain surface layer, thereby forming mainly dangling silicon bonds, i.e., unsaturated silicon bonds, which may typically be separated by OH groups, thereby resulting in the non-desired highly polar nature of the resulting surface. According to the principles disclosed herein, and contrary to conventional silylation strategies in which OH groups are partially replaced by silicon-containing organic groups, a contact of the sensitive surface area having the dangling bonds with polarizable groups, such as OH groups, is strongly suppressed. That is, the device is maintained in a process environment that is depleted of OH groups, which is to be understood as a process environment in which the incorporation of any OH groups or any base molecules resulting in the formation of OH groups, such as water molecules and the like, is actively suppressed, for instance, by providing an appropriate process chamber in which the environmental conditions are appropriately controlled. It should be appreciated, however, that nevertheless minute amounts of OH group-forming molecules may still be present due to inevitable imperfections of any process tools and the like.

Consequently, the reactive surface having the dangling bonds may be treated in the process environment that is depleted of any OH groups so as to introduce appropriate species in order to form, upon activating or initiating a chemical reaction with the dangling bonds, a saturated surface having the desired low-k characteristics. To this end, conventional silylation repair chemicals may be used, while, in other illustrative embodiments disclosed herein, silicon-containing organic species may be applied, which may have a significantly reduced size compared to the conventional silylation chemicals, thereby providing superior diffusion characteristics, which in turn may result in reduced process time and more efficient reconfiguration of the previously damaged surface. In other cases, other organic species may be applied or generally molecules including hydrogen and carbon which may readily react with the dangling bonds so as to establish a substantially hydrophobic surface.

One illustrative method disclosed herein comprises forming a low-k dielectric material above a substrate of a microstructure device. The method further comprises exposing at least a portion of the low-k dielectric material to a reactive process atmosphere in a process chamber, wherein the exposure results in the generation of dangling bonds at a surface area of the low-k dielectric material. The method additionally comprises performing a surface treatment in the process chamber without exposing the low-k dielectric material to ambient atmosphere in order to saturate most of the dangling bonds at the surface area with an organic species. The method further comprises forming a metal-containing material above the surface area.

A further illustrative method disclosed herein relates to processing a low-k dielectric material in a microstructure device. The method comprises forming a dielectric base material above a substrate so as to have a dielectric constant of approximately 3.0 or less, wherein the dielectric base material has a surface including methyl groups. The method further comprises exposing at least a part of the dielectric base material to a reactive process atmosphere in a process environment that is depleted of OH molecules. Moreover, the method comprises forming the low-k dielectric material by saturating dangling bonds of the dielectric base material with an organic group in the process environment that is depleted of OH molecules.

A still further illustrative method disclosed herein comprises forming a low-k dielectric material above the substrate of a semiconductor device, wherein the low-k dielectric material comprises silicon, carbon and oxygen. The method further comprises performing a plasma-assisted etch process so as to form an opening in the low-k dielectric material. The method further comprises, prior to exposing the semiconductor device to OH groups, treating exposed surface portions of the low-k dielectric material by using at least one of a silylation repair chemical, a silicon-containing organic species, including carbon and nitrogen, basic alkanes, alkenes, alkines, alcohols, aldehydes, ketones, amines including an organic group. Moreover, the method comprises forming a metal region on the basis of the opening.

BRIEF DESCRIPTION OF THE DRAWINGS

The disclosure may be understood by reference to the following description taken in conjunction with the accompanying drawings, in which like reference numerals identify like elements, and in which:

FIG. 1c schematically illustrates a cross-sectional view of the microstructure device when exposed to a reactive plasma-based process in a confined process environment, such as a process chamber and the like;

Figure 1A:
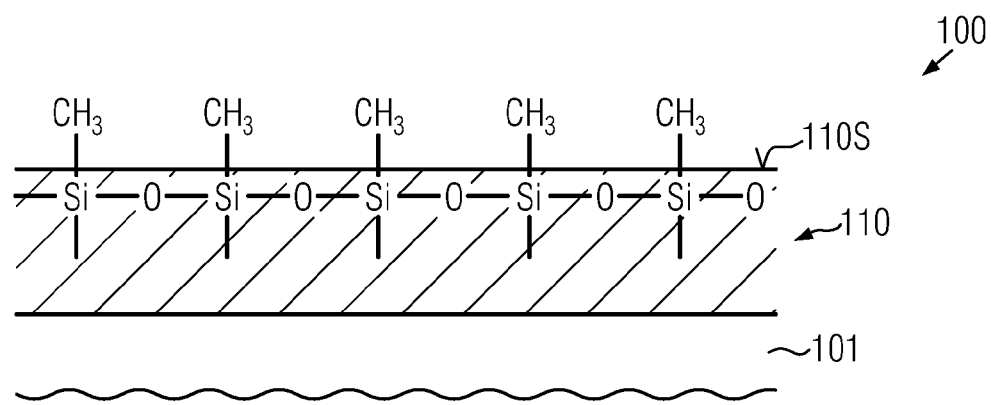
FIG. 1a schematically illustrates a cross-sectional view of a microstructure device comprising a low-k dielectric material, for instance formed on the basis of silicon, oxygen, hydrogen and carbon, which may also have a moderately low dielectric constant at a surface thereof, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides process techniques in which superior characteristics of low-k dielectric materials may be obtained at an interface between the dielectric material and a metal region by reestablishing or even enhancing the initial dielectric and chemical characteristics. To this end, the low-k dielectric material, which is, in some illustrative embodiments, provided in the form of a silicon, oxygen, carbon and hydrogen-containing material, may be exposed to a well-controlled process atmosphere in which the dangling bonds, i.e., any unsaturated bonds at the surface created by a preceding highly reactive process, such as plasma-assisted etch processes, plasma-assisted resist strip processes and the like, are saturated on the basis of any appropriate repair chemical, thereby obtaining the desired hydrophobic surface characteristics. Consequently, after processing at least some surface portions of the low-k dielectric material, for instance by patterning openings, such as trenches and the like, a contact of the damaged surface areas with OH groups is suppressed by establishing an OH group depleted process environment, thereby efficiently avoiding or at least significantly suppressing the generation of silanol groups on the damaged surface areas. Consequently, contrary to conventional silylation approaches, a subsequent replacement of the silanol groups by organic groups of the silylation chemicals is not required since the respective organic species may interact with the dangling bonds without an intermediate step of saturating these dangling bonds with OH groups. For this reason, a significantly increased variety of chemicals is available for establishing the desired surface characteristics of the low-k dielectric material compared to conventional silylation strategies so that, in some illustrative embodiments, molecules of significantly reduced size may be applied, thereby enhancing the overall reaction kinematics, which in turn ensures reduced process times and superior surface characteristics. That is, a significantly increased fraction of the dangling bonds may be saturated by organic groups compared to the conventional silylation strategies.

The chemical reaction for saturating the dangling bonds may be efficiently initiated by using ultraviolet (UV) radiation, infrared (IR) radiation or a temperature increase in the process environment and the surface of the low-k dielectric material, depending on the specific molecules used. In some cases, even a radio frequency energy may be supplied, thereby conditioning the surface and possibly forming ionized molecules in order to increase the overall reaction rate.

The present disclosure may thus be advantageously applied in the context of manufacturing strategies used in sophisticated microelectronic production techniques, in which low-k dielectric materials, such as silicon oxide-based materials, frequently in the form of porous material, may provide superior performance with respect to parasitic capacitance and the like. In this case, damaged surface areas created during the exposure to reactive plasma process atmospheres may be efficiently repaired or even a superior overall material status may be achieved by applying a surface treatment prior to exposing the device to any OH group-containing atmosphere. In this manner, superior process efficiency is achieved, while avoiding the disadvantages of many conventional approaches, which may require the replacement of a damaged surface layer and/or require the application of complex silylation chemicals, which generally suffer from a reduced diffusion capability and a pronounced non-uniformity due to a preceding exposure to OH groups, as discussed above.

FIG. 1*a* schematically illustrates a cross-sectional view of a microstructure device 100, which may generally be understood as a device that may be fabricated and processed on the basis of microelectronic or micromechanical manufacturing techniques. In this embodiment, the device 100 may represent a semiconductor device. The semiconductor device 100 may comprise a substrate 101, which may represent any appropriate carrier material for forming thereabove a dielectric base layer 110 with a dielectric constant of approximately 3.0 less. In some illustrative embodiments, the dielectric layer 110 is a silicon oxide-based layer, as is also discussed above. Hence, in the above defined sense, the dielectric layer 110 may also be referred to as a low-k dielectric material. The semiconductor device 100 may represent any device in which a low k-value of the layer 110 may be required, for instance with respect to electrical performance and the like. It should be appreciated that the dielectric layer 110 may have any appropriate thickness, such as several nanometers to several hundred nanometers or even thicker, depending on the specific configuration of the device 100 and the function of the layer 110 within the device 100. For example, the material of the layer 110 may be used as an efficient fill material for electrically insulating conductive regions of the device 100. As will be described later on in more detail, the dielectric material 110 may represent an interlayer dielectric material, for instance provided in a metallization system of the device 100. The layer 110 may comprise silicon and oxygen in combination with carbon, hydrogen, wherein also other components, such as nitrogen and the like, may be incorporated, depending on the desired material characteristics and the desired dielectric constant.

The dielectric material 110 may be formed by any appropriate deposition process, such as a spin-on process, a CVD process, for instance in the form of a plasma assisted CVD process or a thermally activated CVD process and the like. For example, a plurality of thermally activated CVD recipes may be applied, in which appropriate precursor materials, such as tetramethyloxysilane (TMOS) and/or tetraethyloxysilane (TEOS) and the like may be used for spin-on techniques and CVD processes. Furthermore, low pressure plasma enhanced CVD techniques may be applied, in which the creation of appropriate precursor ions and radicals may provide a significantly enhanced flexibility in selecting an appropriate material composition, since many more reaction paths are available by providing radicals instead of using thermally activated CVD recipes. Furthermore, as indicated above, a further reduction of the material density and thus the dielectric constant may be accomplished by incorporating appropriate species or solvents into the deposition ambient, for instance into the liquid used for spin-on techniques or into the deposition atmosphere of CVD processes. These components may at least be partially driven out of the material as deposited by a corresponding treatment, for instance by heating the layer, performing a radiation treatment and the like. Consequently, a porous structure may be obtained in the layer 110, if required, which may result in an even further reduced dielectric constant, which, however, may also result in an increased surface area at a surface 110S of the layer 110 due to the presence of a plurality of cavities. Depending on the specific deposition conditions and possibly depending on any post-deposition treatments, the layer 110 may have a substantially hydrophobic behavior at its surface 110S, for instance, a methyl group ($CH_3$) may be bonded to corresponding silicon atoms at and near the surface 110S.

Figure 1B:
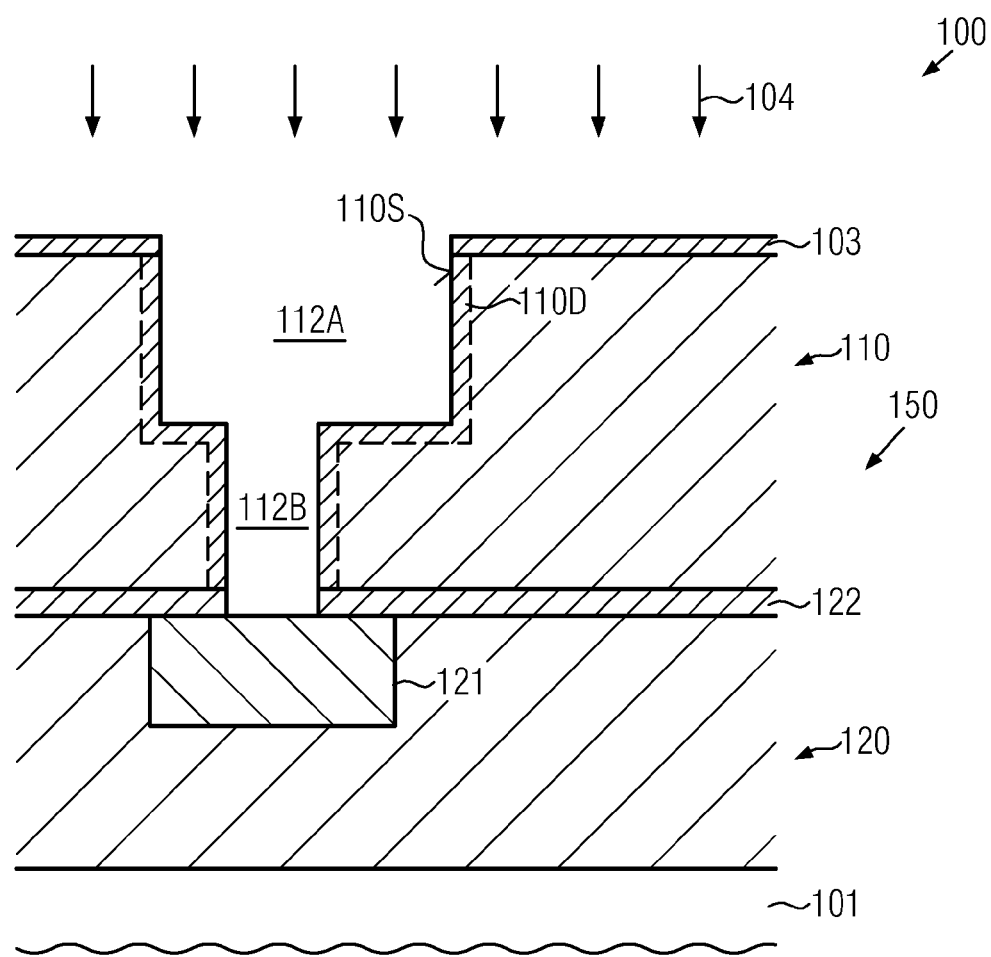
FIG. 1b schematically illustrates a cross-sectional view of the microstructure device according to illustrative embodiments in which the low-k dielectric material is to be treated, for instance to be patterned, in order to form a metallization system of the microstructure device.

FIG. 1b schematically illustrates the semiconductor device 100 in cross-sectional view in a further advanced manufacturing stage. In the embodiment shown, a metallization system 150 may be provided above the substrate 101 in a more or less completed state. For example, a dielectric material layer 120, which may represent a low-k dielectric material or any other appropriate material, may be provided, in which corresponding metal regions, such as metal lines and the like, may be embedded. For convenience, a single metal region 121 is illustrated in FIG. 1b. Furthermore, a cap layer or etch stop layer 122 may be formed on the dielectric material layer 120 and the metal region 121, wherein the layer 122 may be comprised of silicon nitride, nitrogen-containing silicon carbide and the like. The layers 120 and 122 in combination with the metal region 121 may represent a metallization layer of the system 150. In the embodiment shown, the low-k dielectric layer 110 may be formed above the dielectric material 120 and may represent the dielectric material of a further metallization layer of the system 150. In the manufacturing stage shown, the device 100 may be exposed to a reactive process atmosphere 104, for instance in the form of a plasma-assisted etch process, in order to appropriately pattern the low-k dielectric material 110 so as to form corresponding openings 112A, 112B, such as a trench opening in combination with a via opening. The patterning process 104 may be accomplished, for instance, on the basis of a hard mask material 103, such as titanium nitride and the like. During the patterning process 104, exposed surface areas, also indicated by reference number 110S, may thus be created, which may be in contact with the reactive process atmosphere of the process 104. Consequently, a damaged surface layer 110D may be formed, in which the surface characteristics may be significantly modified, as is also discussed above.

It should be appreciated that the semiconductor device 100 as shown in FIG. 1b may be formed on the basis of any well-established process technique for forming any circuit elements in and above the substrate 101 using well-established process strategies, wherein, as discussed above, in sophisticated applications, respective circuit elements may have to be formed on the basis of design rules of 50 nm and less. Thereafter, the layer 120 may be formed, for instance on the basis of process techniques as described above with reference to the low-k dielectric material 110, followed by a patterning process, which may be similar to process techniques as will be described in the context of the layer 110. Thereafter, the metal region 121 may be formed by depositing any appropriate metal, for instance in the form of a conductive barrier material in combination with a highly conductive fill material, such as copper and the like. After the removal of any excess material, the layer 122 may be formed on the basis of any appropriate deposition technique. Next, the low-k dielectric material may be deposited, as described above, and any appropriate process strategy may be applied so as to form an etch mask, for instance for defining the lateral size and position of the via opening 112B, followed by a further patterning process for providing the hard mask 103 used during the process 104.

Figure 1C:
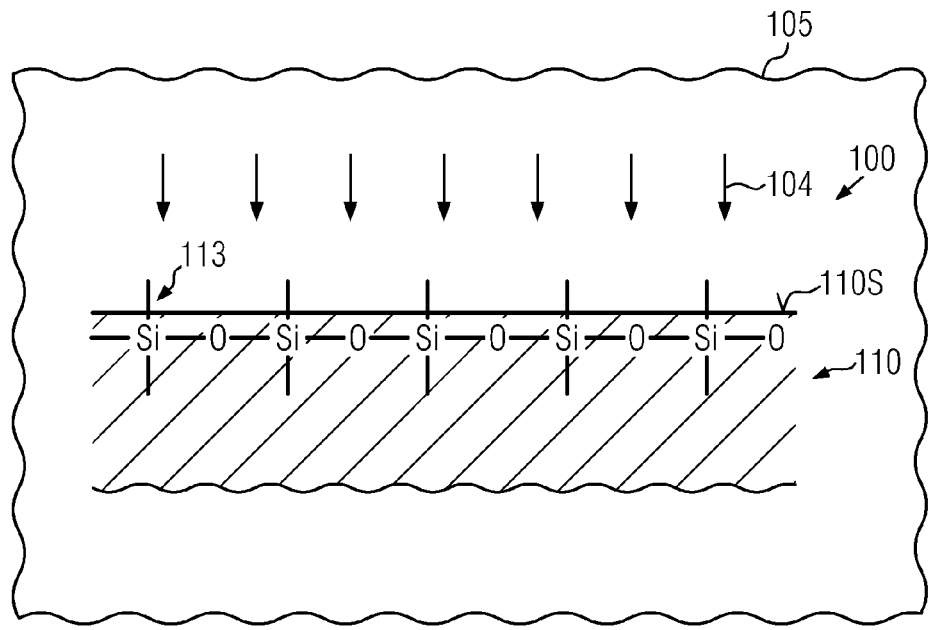

FIG. 1c schematically illustrates the semiconductor device 100 during the patterning process 104. As shown, the device 100 may be treated in a confined process environment 105, which may represent an etch chamber of a plasma etch tool or any other appropriate process tool that is capable of providing the reactive process atmosphere for performing the etch process 104. As shown, during the process 104, material of the layer 110 may be removed, thereby forming the openings 112A, 112B (FIG. 1b), wherein finally a plurality of non-saturated or dangling bonds 113 may be generated at and near the exposed surface 110S. As discussed above, in this state, the surface 110S and any deeper lying areas in which a significant amount of non-saturated silicon bonds may be present may be highly reactive, in particular in view of silanol groups, which would be formed upon exposure to a moisture-containing process ambient. In conventional approaches, however, a corresponding exposure to the ambient atmosphere may be required in view of applying silylation chemicals in a subsequent process stage in order to replace the hydrogen atom of the silanol group with an appropriate hydrocarbon group-containing species.

Contrary to these conventional approaches, in the present disclosure, a surface treatment may be applied in a confined process environment, i.e., without exposing the device 100 to a clean room ambient or any other ambient that may contain or result in the formation of OH groups, in order to saturate the dangling bonds 113 with appropriately selected organic species.

Figure 1D:
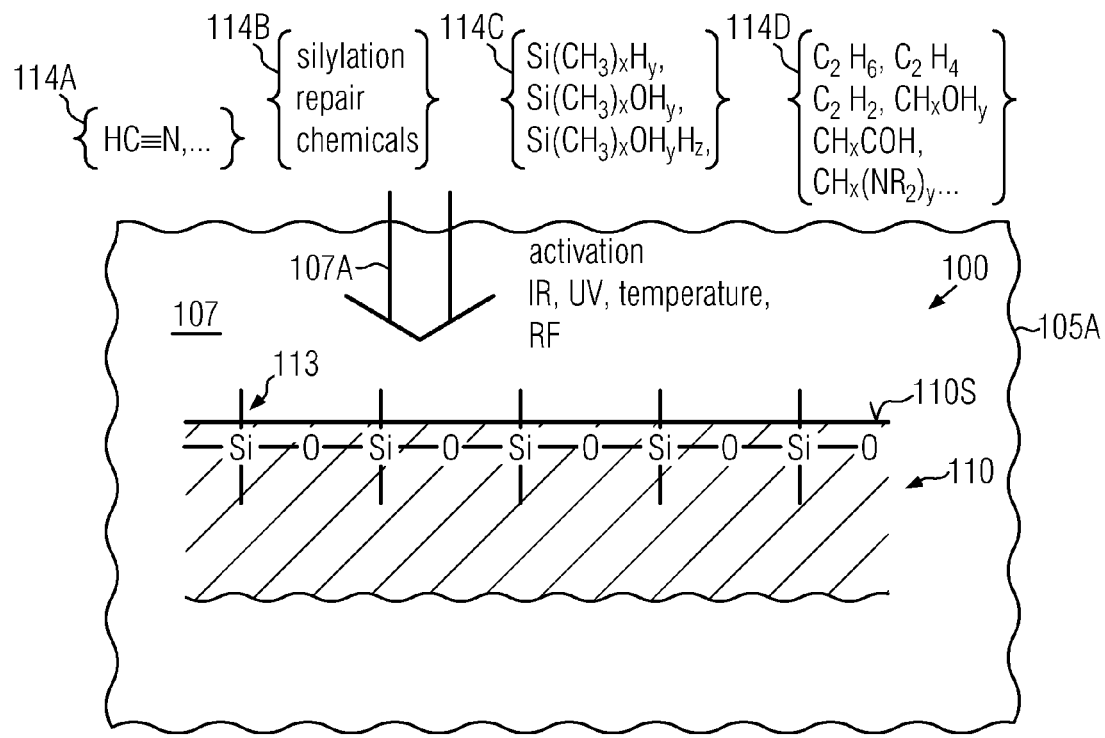
FIG. 1d schematically illustrates a cross-sectional view of the microstructure device during a surface treatment performed in a confined process environment in which the presence of OH groups is actively suppressed in order to contact exposed surface areas of the previously treated device with an appropriate organic species and initiating a chemical reaction, according to illustrative embodiments.

FIG. 1d schematically illustrates the device 100 during a surface treatment 107, which may be performed in a confined process environment 105A, which is established so as to avoid or at least significantly suppress the presence of OH groups. That is, the environment 105A may be established immediately after the plasma treatment in the process environment 105 (FIG. 1c) so as to provide a process atmosphere that is depleted of any OH groups or any substances that may result in the formation of OH groups in order to significantly suppress the saturation of the dangling bonds 113 by any OH groups. In some illustrative embodiments, the confined process environment 105A may represent the environment 105 as used for the process 104 described above with reference to FIGS. 1b and 1c. In other cases, different process environments may be used, however, without exposing the device 100 to ambient atmosphere or to any other ambient, which may result in a significant contamination with OH groups. It should be appreciated that the subsequent processing of the device 100 on the basis of a plasma-based reactive process and the surface treatment 107 without exposure to an OH group-containing atmosphere, except for any unavoidable tool imperfections and the like, may be referred to as an in situ process sequence, irrespective of the fact of whether the same process chamber or different process chambers are used. For example, in some cases, the process environment 105 of FIG. 1c and the process environment 105A may represent one and the same process chamber, in which different process atmospheres are established without intentionally incorporating any OH groups. In other cases, the process environments 105, 105A may be established in a cluster tool on the basis of different process chambers with appropriate substrate transport resources, which may also avoid or suppress the contact of the device with any OH groups. In still other cases, separate process tools may be used, wherein appropriate substrate transport and storage resources are provided in order to avoid undue interaction of the dangling bonds 113 with any OH groups. During the surface treatment 107, appropriate process parameters may be established, for instance, by selecting an appropriate pressure and temperature in order to initiate a chemical reaction on the basis of hydrogen and carbon-containing species in order to saturate at least most of the dangling bonds 113. In some illustrative embodiments, molecules 114A may be used including hydrocarbon groups and other atomic species, such as nitrogen, as, for instance, molecules of the type HC≡N.

In other cases, silylation repair chemicals 114B may be supplied to the process environment 105A, as are also typically used in conventional strategies, however, in this case, these chemicals may directly interact with the dangling bonds 113. For example, chemicals may be used such as $R_3SiNHSiR_3$, $R_xSiCl_y$, $R_xCl(OH)_y$, $R_3SiOSiR_3$, $R_xSi(OR)_y$, $M_pSi(HO)_{4-p}$, $R_xSi(OCOCH_3)_yR$, combinations thereof, wherein x is an integer ranging from 1-3, y is an integer ranging from 1-3 such that y=4-x, p is an integer ranging from 2-3, each R is selected from hydrogen and a hydrophobic organic moiety, each M is an independently selected hydrophobic organic moiety, and R and M can be the same or different.

In other illustrative embodiments, other silicon-containing organic compounds may be used, for instance silicon-containing organic species of the type $Si(CH_3)_xH_y$, $Si(CH_3)_xOH_y$, $Si(CH_3)_xOH_yH_z$, wherein x, y, z are integer numbers in the range 1-3. Moreover, in still other illustrative embodiments, organic molecules may be used, such as basic alkanes ($C_2H_6$), alkenes ($C_2H_4$), alkines ($C_2H_2$), alcohols ($CH_xOH_y$), aldehydes ($CH_xCOH$), ketones ($H_2C=O$), amines ($CH_x(NR_2)_y$), wherein x, y are integer numbers greater than or equal to 1, and R is an organic group.

It should be appreciated that in particular the species 114A, 114C, 114D may generally represent molecules of reduced size compared to, for instance, the repair chemicals 114B, which are frequently used in conventional strategies, thereby generally enhancing the overall diffusion characteristics, thereby also resulting in a superior interaction with the dangling bonds 113 and also with any unsaturated bonds below the surface 110S. In order to initiate the chemical reactions of one or more of the species 114A, 114C, 114D with dangling bonds on and within the material layer 110, in some illustrative embodiments, the generation of plasma conditions is discontinued if, for instance, the process environment 105A is established within the same process environment 105 as may be used for the preceding reactive plasma-based process, such as an etch process and the like. In this case, the initiation of the chemical reaction may be accomplished by an activation mechanism based on UV radiation, wherein an appropriate wavelength or wavelength range may be readily determined on the basis of experiments in which wavelength and intensity of UV radiation for various values may be monitored with respect to the resulting surface characteristics, i.e., the degree of saturation of the dangling bonds 113 with non-polar organic species. It should be appreciated that any such quantitative estimation of the result of the surface treatment 107 for different activation mechanisms and process parameters may be readily obtained on the basis of Fourier transformed infrared spectroscopy (FTIR), which is highly efficient in detecting the chemical characteristics of surface areas of materials.

In other cases, the activation 107A may be initiated by application of infrared radiation, depending on the bonding energies of the various species involved, while also enabling an efficient increase of surface temperature of the layer 110. In still other illustrative embodiments, the activation 107A may be accomplished by increasing temperature of at least the layer 110, which may be accomplished by heating the entire device 100 and/or by applying appropriate radiation and the like.

In other illustrative embodiments, radio frequency (RF) energy may be supplied to the environment 105A, thereby establishing a plasma ambient, wherein, also in this case, appropriate process parameters may be readily established on the basis of experiments.

Figure 1E:
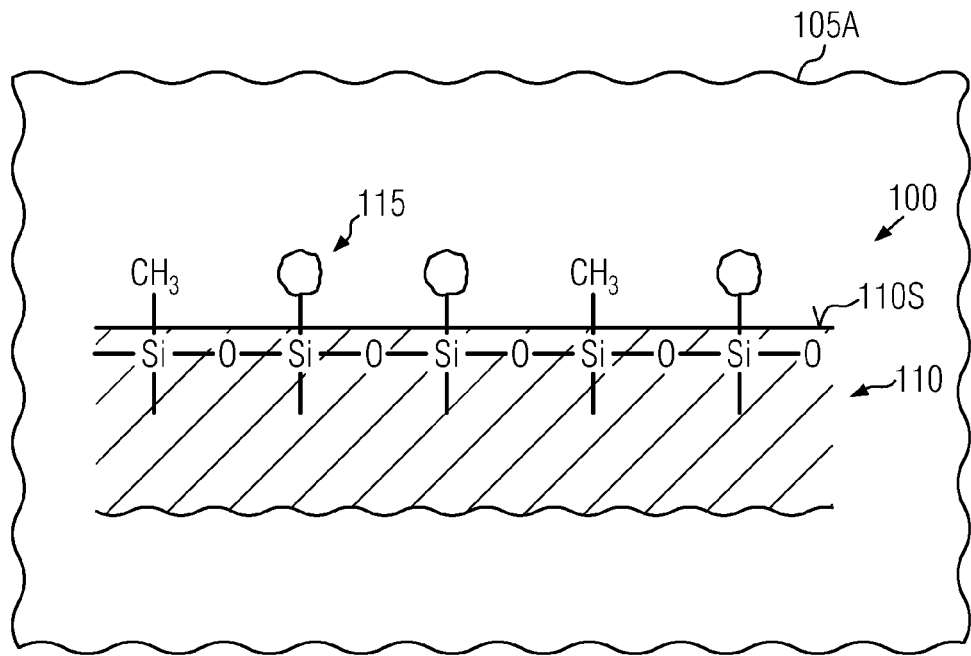
FIG. 1e schematically illustrates a cross-sectional view of the microstructure device in a further advanced stage in which most of the dangling bonds at exposed surface areas have been separated by organic functional groups comprising one or more hydrocarbon groups for reestablishing the dielectric characteristics of the low-k dielectric material, according to illustrative embodiments.

FIG. 1e schematically illustrates the device 100 within the process ambient 105A in a further advanced stage in which most of the non-saturated silicon bonds are now saturated by an organic group 115, such as a methyl group and the like. Consequently, desired low-k dielectric characteristics have been reestablished in a highly efficient manner since generally the organic groups 115 may more efficiently react with the dangling bonds, for instance due to superior surface conditions compared to conventional strategies, in which frequently the presence of additional polarizable molecules, such as water molecules and the like, may generally significantly hinder the chemical reaction between a repair chemical and the previously formed silanol groups. Thus, most of the previously created dangling bonds at and below the surface 110S may be saturated by the groups 115, wherein, in some illustrative embodiments, approximately 90 percent or even more of previously created dangling bonds may be saturated.

Figure 1F:
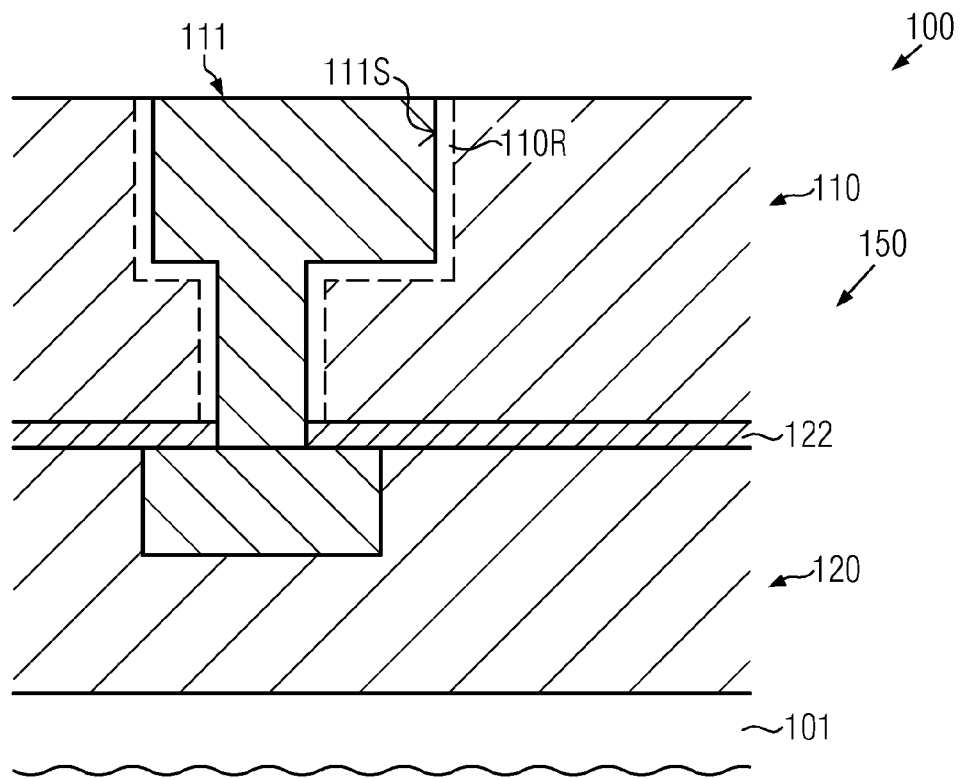
FIG. 1*f* schematically illustrates a cross-sectional view of the microstructure device in the form of a semiconductor device in a further advanced manufacturing stage in which a metal region may be provided in the patterned low-k dielectric material, wherein superior dielectric and chemical characteristics may be obtained at an interface layer, according to still further illustrative embodiments.

FIG. 1f schematically illustrates a cross-sectional view of the device 100 in a further advanced manufacturing stage. As illustrated, a metal region 111 may be formed in the dielectric layer 110 and may comprise any appropriate material or material systems, such as conductive barrier layers (not shown), in combination with any appropriate fill metal, such as copper, and the like. Moreover, as illustrated, the metal region 111 may form an interface 111S with the dielectric layer 110, which may correspond to the surface 110S (FIG.

1b) having experienced a significant damage during the patterning of the layer 110. Due to the subsequent surface treatment 107 (FIG. 1d), an efficient repair mechanism may be implemented, thereby forming an interface layer 110R, which may have substantially the same thickness as the damaged layer 110D of FIG. 1b. That is, as discussed above, the surface treatment 107 (FIG. 1d) results in an efficient saturation of any dangling silicon bonds within the damaged dielectric material. Consequently, generally a superior penetration depth of the repair molecules into the damaged material portions of the layer 110 may be accomplished, in particular when molecules of reduced size are used. Hence, the interface layer 110R, which may represent the restored dielectric material, may have a similar thickness compared to the initially damaged surface layer. For example, the interface layer 110R may comprise a high concentration of silicon atoms bonded to hydrocarbon groups, such as methyl groups, which concentration may be comparable to or even higher as the corresponding concentration of the initial base layer 110 as shown in FIG. 1a. Consequently, although significant damage may have been caused within the interface layer upon processing the low-k dielectric material 110 in a reactive plasma atmosphere, a reduced overall dielectric constant may be reestablished and also a desired hydrophobic surface characteristic may be established due to the process strategy as described above. Hence, the metal region 111 may be embedded in the interface layer 110R, which may have a comparable dielectric constant compared to the remaining portion of the dielectric layer 110.

With respect to forming the metal region 111, any appropriate manufacturing technique may be applied, as is also discussed above.

As a result, the present disclosure provides manufacturing techniques and corresponding semiconductor devices in which damaged surface areas of low-k dielectric materials may be restored on the basis of a surface treatment performed after the reactive plasma process without exposing the device to an ambient including OH groups. Hence, appropriate species may be used so as to directly saturate the dangling silicon bonds. Contrary to conventional silylation strategies, a wide class of chemicals may be used, for instance chemicals including molecules of significantly lesser size compared to conventional silylation chemicals, thereby improving the diffusion conditions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a low-k dielectric material above a substrate of a microstructure device;
    exposing at least a portion of said low-k dielectric material to a reactive process atmosphere in a process chamber, said exposure resulting in the generation of dangling bonds at a surface area of said low-k dielectric material;
    performing a surface treatment in said process chamber without exposing said low-k dielectric material to ambient atmosphere so as to saturate most of said dangling bonds at said surface area with an organic species, wherein performing said surface treatment comprises using a species comprising a molecule of the type $HC\equiv N$; and
    forming a metal-containing material layer above said surface area.

2. The method of claim 1, wherein said organic species comprises a methyl group.

3. The method of claim 1, further comprising discontinuing exposure of said at least a portion of said low-k dielectric material to said reactive process atmosphere prior to performing said surface treatment.

4. The method of claim 1, wherein performing said surface treatment in said process chamber comprises activating a chemical reaction by providing ultraviolet radiation in said process chamber.

5. The method of claim 1, wherein performing said surface treatment in said process chamber comprises activating a chemical reaction by providing infrared radiation in said process chamber.

6. The method of claim 1, wherein performing said surface treatment in said process chamber comprises activating a chemical reaction by increasing a temperature of said low-k dielectric material.

7. The method of claim 1, wherein performing said surface treatment in said process chamber comprises activating a chemical reaction by providing radio frequency (RF) power in said process chamber.

8. The method of claim 1, wherein performing said surface treatment further comprises performing a silylation process.

9. The method of claim 1, wherein performing said surface treatment further comprises using at least one of $Si(CH_3)_xH_y$, $Si(CH_3)_xOH_y$, $Si(CH_3)_xOH_yH_z$, wherein x, y, z are integer numbers in the range of 1-3.

10. The method of claim 1, wherein performing said surface treatment further comprises using at least one of basic alkanes ($C_2H_6$), alkenes ($C_2H_4$), alkines ($C_2H_2$), alcohols ($CH_xOH_y$), aldehydes ($CH_xCOH$), ketones ($H_2C=O$), amines ($CH_x(NR_2)_y$), wherein x, y are integer numbers greater than or equal to 1, and R is an organic group.

11. The method of claim 1, wherein said low-k dielectric material is formed so as to contain silicon, carbon and oxygen.

12. The method of claim 1, wherein said low-k dielectric material is a dielectric material of a metallization system of said microstructure device.

13. A method of processing a low-k dielectric material in a microstructure device, the method comprising:
    forming a dielectric base material above a substrate so as to have a dielectric constant of approximately 3.0 or less, said dielectric base material having a surface including methyl groups;
    exposing at least a part of said dielectric base material to a reactive process atmosphere in a process environment depleted of OH molecules; and
    forming said low-k dielectric material by saturating dangling bonds of said dielectric base material with an organic group in said process environment depleted of OH molecules, wherein saturating dangling bonds of said dielectric base material comprises using a species comprising a molecule of the type $HC\equiv N$.

14. The method of claim 13, wherein saturating dangling bonds of said dielectric base material further comprises using at least one of $Si(CH_3)_xH_y$, $Si(CH_3)_xOH_y$, $Si(CH_3)_xOH_yH_z$, wherein x, y, z are integer numbers in the range of 1-3.

15. The method of claim 13, wherein saturating dangling bonds of said dielectric base material further comprises using at least one of basic alkanes ($C_2H_6$), alkenes ($C_2H_4$), alkines ($C_2H_2$), alcohols ($CH_xOH_y$), aldehydes ($CH_xCOH$), ketones ($H_2C=O$), amines ($CH_x(NR_2)_y$), wherein x, y are integer numbers greater than or equal to 1, and R is an organic group.

16. A method, comprising:
forming a low-k dielectric material above a substrate of a semiconductor device, said low k-dielectric material comprising silicon, carbon and oxygen;
performing a plasma-assisted etch process so as to form an opening in said low-k dielectric material;
prior to exposing said semiconductor device to OH groups, treating exposed surface portions of said low-k dielectric material by using at least one of a silylation repair chemical, a silicon-containing organic species, a molecule of the type HC≡N, basic alkanes ($C_2H_6$), alkenes ($C_2H_4$), alkines ($C_2H_2$), alcohols ($CH_xOH_y$), aldehydes ($CH_xCOH$), ketones ($H_2C=O$), amines ($CH_x(NR_2)_y$), wherein x, y are integer numbers greater than or equal to 1, and R is an organic group, wherein treating the exposed surface portions comprises activating a chemical reaction by providing at least one of radio frequency (RF) power and infrared radiation in said process chamber; and
forming a metal region on the basis of said opening.

17. The method of claim 16, wherein said plasma-assisted etch process and said treatment of exposed surface portions are performed in the same process chamber without intermediate exposure to ambient atmosphere.

18. A method, comprising:
forming a low-k dielectric material above a substrate of a microstructure device;
exposing at least a portion of said low-k dielectric material to a reactive process atmosphere in a process chamber, said exposure resulting in the generation of dangling bonds at a surface area of said low-k dielectric material;
performing a surface treatment in said process chamber without exposing said low-k dielectric material to ambient atmosphere so as to saturate most of said dangling bonds at said surface area with an organic species, wherein performing said surface treatment in said process chamber comprises introducing hydrogen and carbon containing species into said process chamber and activating a chemical reaction by providing infrared radiation in said process chamber; and
forming a metal-containing material layer above said surface area.

19. The method of claim 18, wherein performing said surface treatment comprises performing a silylation process.

20. The method of claim 18, wherein performing said surface treatment comprises using at least one of $Si(CH_3)_xH_y$, $Si(CH_3)_xOH_y$, $Si(CH_3)_xOH_yH_z$, wherein x, y, z are integer numbers in the range of 1-3.

21. The method of claim 18, wherein performing said surface treatment comprises using at least one of basic alkanes ($C_2H_6$), alkenes ($C_2H_4$), alkines ($C_2H_2$), alcohols ($CH_xOH_y$), aldehydes ($CH_xCOH$), ketones ($H_2C=O$), amines ($CH_x(NR_2)_y$), wherein x, y are integer numbers greater than or equal to 1, and R is an organic group.

22. A method, comprising:
forming a low-k dielectric material above a substrate of a microstructure device;
exposing at least a portion of said low-k dielectric material to a reactive process atmosphere in a process chamber, said exposure resulting in the generation of dangling bonds at a surface area of said low-k dielectric material;
performing a surface treatment in said process chamber without exposing said low-k dielectric material to ambient atmosphere so as to saturate most of said dangling bonds at said surface area with an organic species, wherein performing said surface treatment in said process chamber comprises introducing hydrogen and carbon containing species into said process chamber and activating a chemical reaction by providing radio frequency (RF) power in said process chamber; and
forming a metal-containing material layer above said surface area.

23. The method of claim 22, wherein performing said surface treatment comprises performing a silylation process.

24. The method of claim 22, wherein performing said surface treatment comprises using at least one of $Si(CH_3)_xH_y$, $Si(CH_3)_xOH_y$, $Si(CH_3)_xOH_yH_z$, wherein x, y, z are integer numbers in the range of 1-3.

25. The method of claim 22, wherein performing said surface treatment comprises using at least one of basic alkanes ($C_2H_6$), alkenes ($C_2H_4$), alkines ($C_2H_2$), alcohols ($CH_xOH_y$), aldehydes ($CH_xCOH$), ketones ($H_2C=O$), amines ($CH_x(NR_2)_y$), wherein x, y are integer numbers greater than or equal to 1, and R is an organic group.

* * * * *